United States Patent
Shimada (10) Patent No.: US 6,323,051 B1
(45) Date of Patent: Nov. 27, 2001

(54) METHOD OF MANUFACTURING LIQUID CRYSTAL DISPLAY

(75) Inventor: Yoshinori Shimada, Taki-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/520,341

(22) Filed: Mar. 7, 2000

(30) Foreign Application Priority Data

Mar. 10, 1999 (JP) .................................. 11-063830

(51) Int. Cl.$^7$ ...................................... H01L 21/00
(52) U.S. Cl. .................. 438/30; 438/30; 349/1; 349/42; 349/43; 257/72
(58) Field of Search .................. 438/30; 349/1, 349/42, 43; 257/72

(56) References Cited

U.S. PATENT DOCUMENTS

| | | | |
|---|---|---|---|
| 5,032,536 | * | 7/1991 | Oritsuki et al. ............... 437/51 |
| 5,498,573 | * | 3/1996 | Whetten ........................ 437/192 |
| 5,541,748 | * | 7/1996 | Ono et al. ..................... 359/59 |
| 5,641,974 | * | 6/1997 | Den Boer et al. .............. 257/59 |
| 5,650,834 | * | 7/1997 | Nakagawa et al. ............. 349/139 |
| 6,078,365 | * | 6/2000 | Ueda et al. .................... 349/43 |
| 6,194,783 | * | 10/1998 | Raina ............................ 257/765 |
| 6,218,678 | * | 4/2001 | Zhang et al. ................... 257/59 |

OTHER PUBLICATIONS

Japanese Kokai (Published unexamined patent application) No. 152626/1997 (Tokukaihei 9–152626, Published Date: Jun. 10, 1997).

Japanese Kokai (Published unexamined patent application) No. 197433/1997 (Tokukaihei 9–197433, Published Date: Jul. 31, 1997).

* cited by examiner

Primary Examiner—Matthew Smith
Assistant Examiner—Granvill D Lee, Jr.
(74) Attorney, Agent, or Firm—Nixon & Vanderhye P.C.

(57) ABSTRACT

A manufacturing method of a liquid crystal display of the present invention is a manufacturing method of a liquid crystal display having a glass substrate provided thereon with a matrix of thin film transistors, each having a semiconductor film pattern formed by photo-etching a high-resistance semiconductor film and a low-resistance semiconductor film, and a third metal film serving as a source metal film layer layered on the semiconductor film pattern, in which the semiconductor film pattern is formed on the glass substrate first, and thence the third metal film is layered on the glass substrate. Consequently, a liquid crystal display can be manufactured with a fewer number of manufacturing steps while at the same time the manufacturing costs can be saved by preventing a decrease in the yield caused by film separation.

15 Claims, 7 Drawing Sheets

METHOD OF MANUFACTURING LIQUID CRYSTAL DISPLAY

FIELD OF THE INVENTION

The present invention relates to a method of manufacturing a liquid crystal display, and more particularly, to a method of manufacturing an active matrix type liquid crystal display in which a matrix of switching thin film transistors are formed in one-to-one correspondence with pixel portions.

BACKGROUND OF THE INVENTION

Generally, an active matrix type liquid crystal display is advantageous in many aspects, such as low power consumption, thinness, and lightness, and therefore, has been showing promise for use as a display device in diversified fields including a notebook personal computer, a mobile terminal, a TV set, etc.

Under these circumstances, there has been an increasing need for an inexpensive active matrix type liquid crystal display. To this end, various techniques have been discussed to save the manufacturing costs by improving productivity of a thin film transistor (TFT) array substrate. Among others, a technique for reducing the number of times a photomask is used during the manufacturing procedure of the active matrix type liquid crystal display has been studied extensively.

For example, Japanese Laid-open Patent Application No. 152626/1997 (Japanese Official Gazette, *Tokukaihei* No. 9-152626, publishing date: Jun. 10, 1997) discloses a manufacturing procedure using the photomask a fewer number of times. The following will describe an active matrix type liquid crystal display and the manufacturing method thereof in accordance with the above publication with reference to FIGS. 5(a) through 5(d), 6 and 7.

FIGS. 5(a) through 5(d) are cross sections showing the manufacturing procedure of an outlet electrode portion of a source signal line and the vicinity thereof in a TFT array substrate forming the active matrix type liquid crystal display disclosed in the above publication. Also, FIG. 6 is a plan view of the TFT array substrate forming the active matrix type liquid crystal display disclosed in the above publication. Further, FIG. 7 is a cross section explaining an arrangement of a thin film transistor 121 and the vicinity thereof in the TFT array substrate forming the active matrix type liquid crystal display disclosed in the above publication.

Figure 6:
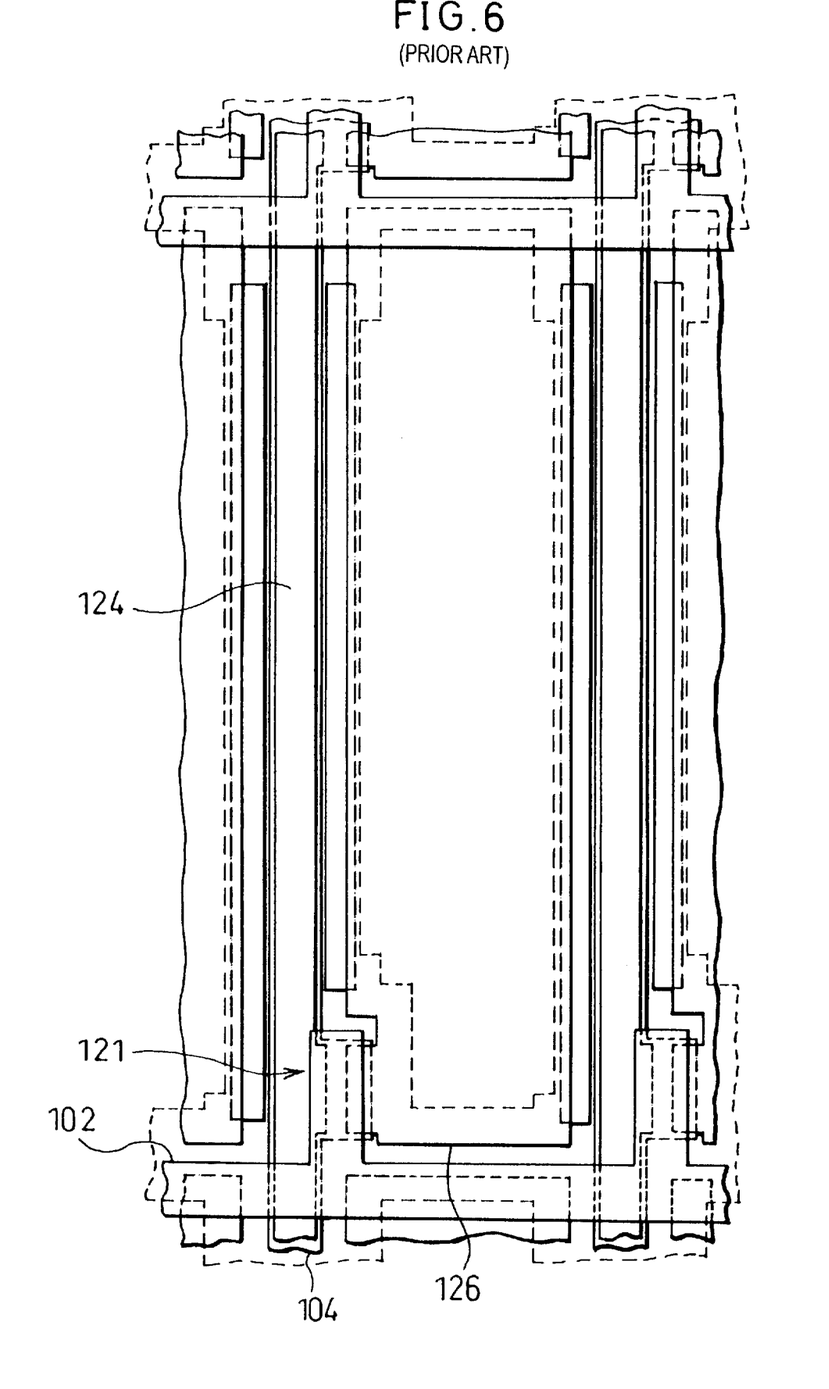
FIG. 6 is a plan view showing the TFT array substrate forming the conventional active matrix type liquid crystal display.
Figure 7:
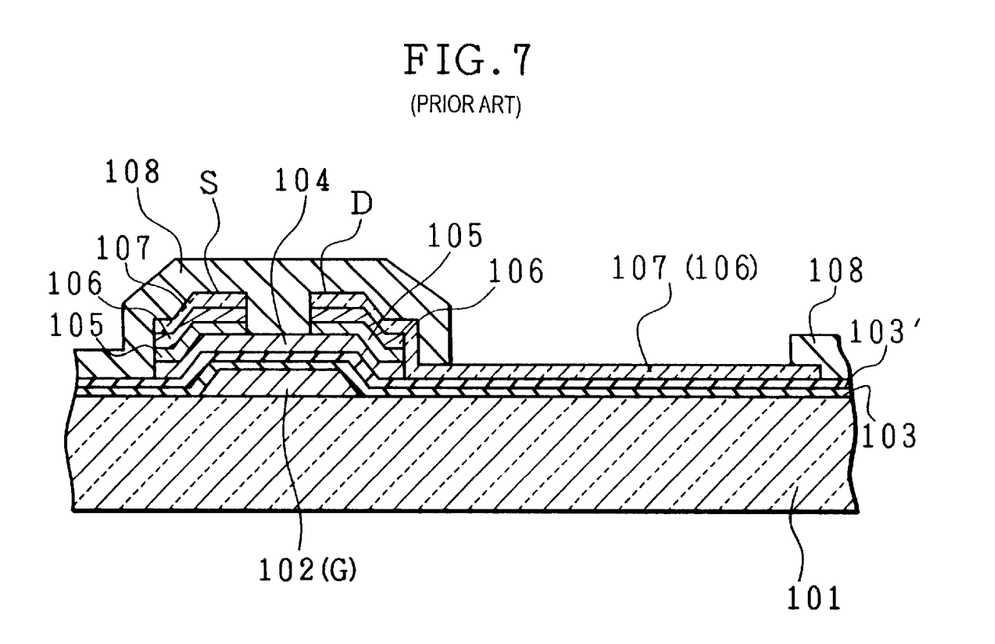
FIG. 7 is a cross section explaining an arrangement of a thin film transistor and the vicinity thereof on the TFT array substrate forming the conventional active matrix type liquid crystal display.

As shown in FIGS. 6 and 7, the active matrix type liquid crystal display disclosed in the above publication includes a TFT array substrate described more in detail below, an unillustrated counter electrode substrate provided with a counter electrode, unillustrated liquid crystal sealed in a space between these substrates, etc. The TFT array substrate has a glass substrate 101 provided with ① a plurality of gate signal lines (scanning signal lines) 102 and a plurality of source signal lines (image signal lines) 124 formed on the surface of the glass substrate 101 through insulating films 103 and 103' in such a manner so as to intersect with each other at right angles, ② a matrix of pixel electrodes 126 each formed at each intersection of the gate signal lines 102 and source signal lines 124, and ③ a matrix of TFTs 121 of a reverse stagger type formed in one-to-one correspondence with the pixel electrodes 126 to supply a pixel signal to the same. It should be appreciated that the TFTs 121 of the reverse stagger type do not require an etching stopper film in a channel region.

As shown in FIG. 7, each TFT 121 comprises a gate electrode G which protrudes upward perpendicularly from the gate signal line 102, a gate insulating film composed of the insulating films 103 and 103', a high-resistance semiconductor film 104 which will be made into a channel region, a low-resistance semiconductor film 105 which will be made into a source electrode S and a drain electrode D, a source metal film 106, a transparent conductive film 107, and a protection film 108, which are layered sequentially from bottom to top in this order.

Next, the following will explain a conventional manufacturing method of the active matrix type liquid crystal display with reference to FIGS. 5(a) through 5(d).

Initially, as shown in FIG. 5(a), the gate signal line 102 and gate electrode G are formed by forming a film of aluminum alloy, metal having a high melting point, or the like on the glass substrate 101 by means of sputtering, etc. and patterning (forming a pattern on) the film thus formed.

Then, as shown in FIG. 5(b), a double-layer structure composed of the insulating films 103 and 103', the high-resistance semiconductor film 104, and the low-resistance semiconductor film 105 are formed sequentially by means of plasma CVD (Chemical Vapor Deposition), etc. Subsequently, the source metal film 106 is formed on the foregoing films out of metal having a high melting point or alloy of such metals by means of sputtering, etc. Then, the source metal film 106, low-resistance semiconductor film 105, and high-resistance semiconductor film 104 thus formed are photo-etched with a pattern simultaneously by using a single photomask.

Figure 5:
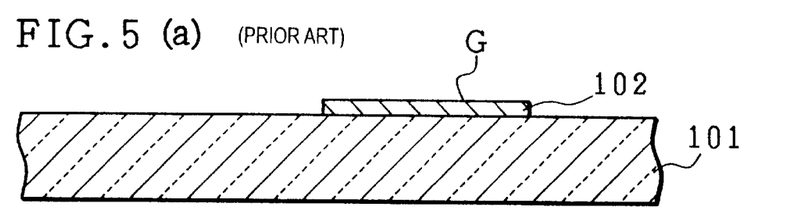

Then, as shown in FIG. 5 (c), the transparent conductive film 107 is formed on the source metal film 106 out of ITO (Indium-Thin Oxide), etc. by means of sputtering, etc. Subsequently, the transparent conductive film 107, source metal film 106, and low-resistance conductive film 105 are selectively photo-etched by using a single photomask.

Then, by forming the protection film 108 and removing a part thereof, a TFT 121', and unillustrated source signal line 124 and pixel electrode 126, etc. are formed.

Finally, as shown in FIG. 5 (d), by forming the protection film 108 out of a film of silicon nitride, etc. by means of plasma CVD, etc. and patterning the same, the protection film 108 covering the unillustrated external outlet electrode portion of the source signal line 124 and pixel electrode portion 126 is removed, while at the same time the insulating films 103 and 103' and protection film 108 covering the unillustrated external outlet electrode portion of the gate signal line 102 are removed, whereby the TFT array substrate is completed.

As has been discussed, according to the conventional manufacturing method of the active matrix type liquid crystal display, the TFT array substrate is manufactured by the manufacturing procedure which repeats the photo-litho process (photo-etching process) four times to form the pixel electrode 126, the external outlet electrode portion of the source signal lines 124, and the external outlet electrode portion of the gate signal line 102 separately.

According to the above conventional manufacturing method of the active matrix type liquid crystal display, however, the source metal film 106 is formed by means of sputtering, etc. without patterning after the insulating films 103 and 103', high-resistance semiconductor film 104, and low-resistance semiconductor film 105 are formed sequentially by means of plasma CVD, etc. Thus, an interface between the low-resistance semiconductor film 105 and source metal film 106 is quite large. In other words, both the low-resistance semiconductor film 105 and source metal film 106 are formed on the entire TFT array substrate. Thus, when the source metal film 106 is formed, these two films contact with each other in an area as large as the entire TFT array substrate. Hence, the area of the interface is substantially as large as that of the entire TFT array substrate.

Also, the semiconductor layer composed of the high-resistance semiconductor film 104 and low-resistance semiconductor film 105 has a large film stress (when a stress is applied, a corresponding strain is produced, and the film stress is defined as the ratio of stress to the strain of the film per unit area on the film surface). Thus, adhesion between the low-resistance semiconductor film 105 and source metal film 106 becomes poor due to a large interface therebetween, thereby causing problematic film separation between the low-resistance semiconductor film 105 and source metal film 106.

In short, film separation occurred during the manufacturing procedure of the TFT array substrate causes an unwanted decrease in the yield of the active matrix type liquid crystal displays.

SUMMARY OF THE INVENTION

The present invention was devised to solve the above problems, and therefore, has an object to provide a manufacturing method of an inexpensive active matrix type liquid crystal display by including a fewer number of manufacturing processes and preventing a decrease in the yield caused by film separation.

The inventors of the present invention conducted an assiduous study to solve the above problems and completed the present invention when they discovered that the above object can be fulfilled by forming a semiconductor film pattern by patterning a semiconductor film layer of a TFT forming a TFT array substrate, and then forming and layering a transparent conductive layer and a source metal film layer thereon.

In order to fulfill the above and other objects, a manufacturing method of the present invention of a liquid crystal display having a matrix of thin film transistors, gate signal lines for controlling the thin film transistors and source signal lines for supplying a data signal to the thin film transistors provided in such a manner so as to intersect with each other at right angles, pixel electrodes connected to the source signal lines via the thin film transistors, and a liquid crystal material withheld in a space between the pixel electrodes and a counter electrode provided to oppose the pixel electrodes, is characterized by including the steps of:

effecting first photo-etching after layering a first metal film and a second metal film sequentially on a substrate to form the thin film transistors and gate signal lines and external outlet electrode portions of the gate signal lines;

layering an insulating film, a high-resistance semiconductor film, and a low-resistance semiconductor film entirely on the substrate on which a pattern has been formed in the first photo-etching;

effecting second photo-etching on the low-resistance semiconductor film and high-resistance semiconductor film to form a semiconductor film pattern on the thin film transistors;

layering a transparent conductive film, a third metal film, and a fourth metal film sequentially and entirely on the substrate on which the semiconductor film pattern has been formed;

effecting third photo-etching on the fourth metal film, third metal film, transparent conductive film, and the low-resistance semiconductor film of the semiconductor film pattern to form the source signal lines, external outlet electrode portions of the source signal lines, source and drain electrodes and pixel electrodes of the thin film transistors;

forming a protection film entirely on the substrate on which the source, drain, and pixel electrodes have been formed;

effecting fourth photo-etching on the protection film and insulating film to let the external outlet electrode portions of the gate signal lines, the external outlet electrode portions of the source signal lines, and the pixel electrodes be exposed; and effecting etching on the second metal film, third metal film, and fourth metal film of the external outlet electrode portions of the gate signal lines, the external outlet electrode portions of the source signal lines, and the pixel electrodes, all of which are now exposed.

According to the above method, even when the transparent conductive film, third metal film, and fourth metal film are sequentially layered on the entire main surface of the substrate, the semiconductor film pattern which has been already formed has a small contact area to the transparent conductive film. Consequently, adhesion between the films becomes satisfactory and no film separation will occur, thereby making it possible to stabilize the yield.

For a fuller understanding of the nature and advantages of the invention, reference should be made to the ensuing detailed description taken in conjunction with the accompanying drawings.

BRIEF DESCRIPTION OF THE DRAWINGS

FIGS. 1(*a*) through 1(*d*) are cross sections taken on line A—A' in FIG. 2 explaining a manufacturing method of a liquid crystal display in accordance with one embodiment of the present invention; FIG. 1 (*a*) explains formation of a gate signal line; FIG. 1(*b*) explains formation of an insulating film and a semiconductor film; FIG. 1(*c*) explains formation of a transparent conductive film and a metal film; and FIG. 1(*d*) explains formation of a protection film.

FIGS. 5(*a*) through 5(*d*) are cross sections showing a conventional manufacturing procedure of an outlet electrode portion of a source signal line and the vicinity thereof on the TFT array substrate forming an active matrix type liquid crystal display; FIG. 5(*a*) explains formation of a gate signal line; FIG. 5(*b*) explains formation of an insulating film, a semiconductor film, and a source signal line; FIG. 5(*c*) explains formation of a transparent conductive film; and FIG. 5(*d*) explains formation of a protection film.

DESCRIPTION OF THE EMBODIMENTS

Referring to the accompanying drawings, the following description will describe embodiments of the present invention.

Embodiment 1

Figure 1:
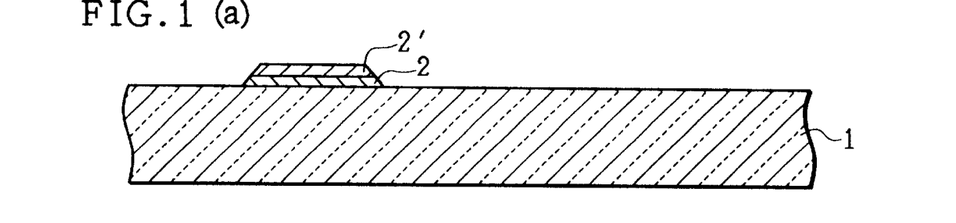
Figure 2:
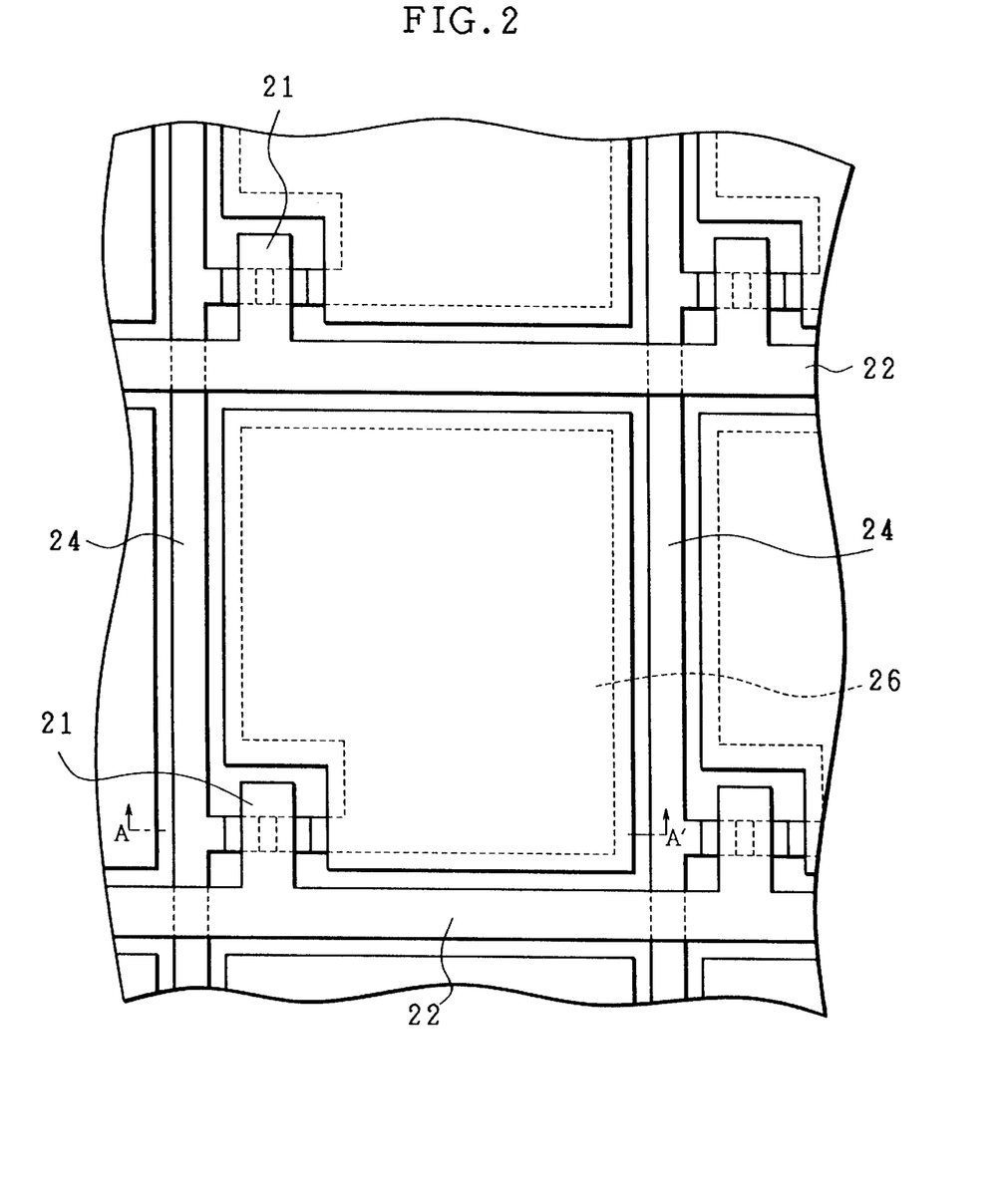
FIG. 2 is a plan view showing a TFT array substrate forming the liquid crystal display in accordance with one embodiment of the present invention.

FIGS. 1(a) through 1(d) are cross sections taken on line A—A' in FIG. 2, explaining a manufacturing method of a liquid crystal display of the present embodiment. FIG. 2 is a plan view depicting a TFT array substrate forming the liquid crystal display of the present embodiment.

As shown in FIG. 2, the TFT array substrate of the present embodiment is provided with, on its main surface, a plurality of parallel gate signal lines 22 and a plurality of parallel source signal lines 24, which are aligned in such a manner so as to intersect with each other at right angles, thereby forming a matrix. More specifically, the gate signal lines 22 and source signal lines 24 are provided on the TFT array substrate through an insulating film 3 shown in FIG. 1 in such a manner so as to intersect with each other at right angles, and a pixel electrode 26 is provided at each intersection of the gate signal lines 22 and source signal lines 24. Further, a matrix of TFTs 21 are provided in one-to-one correspondence with the pixel electrodes 26 to supply a data signal (pixel signal) to the pixel electrodes 26 from the source signal lines 24.

External outlet electrode portions 23 (see FIG. 3) of the gate signal lines (22) and external outlet electrode portions 25 (see FIG. 4) of the source signal lines (24) are provided on extensions of their respective lines at an unillustrated peripheral portion of the TFT array substrate, through which the TFT array substrate is connected to an outside driving circuit.

The following will explain a manufacturing method of the liquid crystal display of the present embodiment by using a photo-etching process for the TFT 21 as an example.

According to the manufacturing method of the liquid crystal display of the present embodiment, as shown in FIG. 1(a), a 500 Å-thick titanium layer which will be made into a first metal film 2 and a 3000 Å-thick aluminum layer which will be made into a second metal film 2' are vapor deposited on the glass substrate 1 sequentially in this order from bottom to top by means of sputtering.

Then, in the first photo-etching process, the first metal film 2 and second metal film 2' are photo-etched with a pattern, whereby the gate signal line 22 and the unillustrated external outlet electrode portion 23 thereof on the TFT 21 are formed. In other words, the gate signal line 22 and the external outlet electrode portion 23 thereof are formed out of a double-layer structure composed of the first metal film 2 and second metal film 2' with the latter being layered on the former by the first photo-etching process.

Metals used for the first metal film 2 are not especially limited, and examples thereof include titanium, chromium, and molybdenum, etc. Of all the examples, titanium is particularly preferred.

For instance, in case that the external outlet electrode portion 23 of the gate signal line is connected to an outside driving circuit by means of TAB (Tape Automated Bonding), if the first metal film 2, which will be made into the connection terminal to the outside driving circuit, that is, the external outlet terminal of the gate signal line 22, is made of titanium, selective photo-etching can be effected in a reliable manner.

To be more specific, for example, in case that the first metal film 2 is made of titanium and the second metal film 2' is made of a low-resistance line of aluminum or the like, then the gate pattern of the gate signal line 22 and the external outlet electrode portion 23 thereof can be readily formed by means of dry etching. At the same time, by effecting wet etching when the external outlet terminal of the gate signal line 22 is formed, only titanium forming the first metal film 2 is selectively left whereas a portion of the second metal film 2' is removed.

As has been discussed, because titanium is not readily oxidized compared with aluminum, by making the first metal film 2 out of titanium, electrical connection between the external outlet terminal made of titanium and the outside driving circuit can be ensured.

Also, by making the second metal film 2' out of aluminum or aluminum alloy, for example, an effect of reducing line resistance can be attained, while at the same time titanium alone can be readily and selectively left in a reliable manner by means of wet etching.

Then, as shown in FIG. 1 (b), a 4000 Å-thick silicon nitride film which will serve as the insulating film 3, a 1500 Å-thick amorphous silicon film which will be made into the high-resistance semiconductor film 4 (high-resistance semiconductor film layer), and a 500 Å-thick amorphous silicon film which has been doped with impurities and will be made into the low-resistance semiconductor film 5 (low-resistance semiconductor film layer) are layered sequentially from bottom to top in this order by means of plasma CVD on the entire glass substrate 1 on which the gate pattern, that is, a pattern of the gate signal line 22 and the external outlet electrode portion 23 thereof, has been formed.

Then, in the second photo-etching process, a semiconductor film pattern is formed as a semiconductor area on the TFT 21 by selectively photo-etching the high-resistance semiconductor film 4 and the low-resistance semiconductor film 5 layered thereon by using a single photomask.

Then, as shown in FIG. 1(c), a 1000 Å-thick ITO film which will be made into the transparent conductive film 6, a 1000 Å-thick molybdenum film which will be made into a third metal. film 71 and a 1000 Å-thick aluminum film which will be made into a fourth metal film 7' are vapor deposited on the entire glass substrate 1 sequentially from bottom to top in this order by means of sputtering.

Then, in the third photo-etching process, the sequentially layered fourth metal film 7', third metal film 7, and transparent conductive film 6 are photo-etched simultaneously by using a single photomask. Further, an exposed portion of the low-resistance semiconductor film 5 (low-resistance semiconductor film layer) in the TFT 21 as the result of the preceding photo-etching is selectively photo-etched by using the same photomask.

As a result of the third photo-etching process, the source electrode S and drain electrode D, and pixel electrode 26 of the TFT 21, and unillustrated source signal line 24 and external outlet electrode portion 25 thereof are formed.

Metals used for the third metal film 7 are not especially limited, and examples thereof include molybdenum, titanium, chromium, etc. Of all the examples, molybdenum is particularly preferred.

By making the third metal film 7 out of molybdenum, electric erosion can be prevented, because ITO forming the pixel electrode 26 does not directly touch aluminum, etc. More specifically, electric erosion can be prevented by layering molybdenum as the third metal film 7 on ITO as the pixel electrode 26, and layering aluminum as the fourth metal film 7' on molybdenum.

Also, molybdenum can be readily removed by means of wet etching with an etchant mainly made of phosphoric acid and nitric acid, which is also used in wet etching aluminum. This means that molybdenum and aluminum can be wet etched simultaneously, and therefore, efficiency can be improved by using molybdenum.

Further, if the fourth metal film 7' is made of aluminum or aluminum alloy, for example, then, it can be wet etched simultaneously with the second metal film 2' also made of aluminum or aluminum alloy when letting the pixel electrode 26 and external outlet terminal of the gate signal line 22 be exposed. Consequently, because the photo-etching process can be omitted, efficiency can be improved.

Finally, as shown in FIG. 1(d), a 2000 Å-thick silicon nitride film is formed on the entire glass substrate 1 as the protection film 8 by means of plasma CVD. Then, in the fourth photo-etching process, the protection film 8 and/or insulating film 3 are photo-etched simultaneously by using a single photomask to let the pixel electrode 26, the external outlet electrode portion 23 of the gate signal line shown in FIG. 3, and the external outlet electrode portion 25 of the source signal line shown in FIG. 4 be exposed on the TFT array substrate surface. Consequently, the external outlet electrode portion 23 of the gate signal line and the external outlet electrode portion 25 of the source signal line are exposed on the TFT array substrate surface, and the fourth metal film 7' layered on the pixel electrode 26 is exposed as well.

Subsequently, the second metal film 2' formed as the exposed external outlet electrode portion 23 of the gate signal line as the result of the preceding photo-etching, the third metal film 7 and fourth metal film 7' formed on the also exposed external outlet electrode portion 25 of the source signal and pixel electrode 26 as the result of the preceding photo-etching are photo-etched simultaneously, whereby the TFT array substrate is completed.

The mask pattern used for forming the exposed portion of the fourth metal film 7' and third metal film 7 layered on the pixel electrode 26 by photo-etching the protection film 8 may be arranged in such a manner so as to make the exposed portion larger than the pixel electrode 26. In other words, the size of the exposed portion is set in such a manner that unwanted portion of the residual low-resistance semiconductor film 5 can be removed by means of photo-etching simultaneously when the protection film 8 is photo-etched.

According to the above method, the unwanted residual low-resistance semiconductor film 5 between the drain electrode D, pixel electrode 26, and source signal line 24 can be readily removed when letting the pixel electrode 26 be exposed by removing the fourth metal film 7' and third metal film 7. Consequently, short-circuit between the pixel electrode 26 and source signa line 24, or short-circuit between the pixel electrodes 26 can be prevented, thereby making it possible to improve the yield.

As has been discussed, according to the manufacturing method of the liquid crystal display of the present embodiment, the TFT array substrate can be formed by the photo-etching processes from first to fourth, thereby making the manufacturing procedure simpler.

In addition, by selectively photo-etching the sequentially layered low-resistance semiconductor film 5 and high-resistance semiconductor film 4 simultaneously by using a single photomask in the second photo-etching process, the transparent conductive film 6, third metal film 7, and fourth metal film 7' are formed sequentially in layers on the entire glass substrate 1 after the semiconductor film pattern of the TFT 21 has been formed. Consequently, film separation can be prevented.

In other words, even when the transparent conductive film 6 or source metal film layer, etc. are layered on the entire glass substrate 1, because the semiconductor film pattern as the semiconductor area has been already formed in the second photo-etching process, the interface between the low-resistance semiconductor film 5 and high-resistance semiconductor film 4, that is, an interface between a semiconductor film pattern having a large film stress and the transparent conductive film 6 or source metal film layer, is small. Consequently, adhesion between the films becomes satisfactory and no film separation will occur, thereby making it possible to stabilize the yield.

Embodiment 2

The following will explain another embodiment of the manufacturing method of the TFT array substrate. Hereinafter, like components are labeled with like reference numerals with respect to Embodiment 1, and the description of these components is not repeated for ease of explanation.

Figure 3:
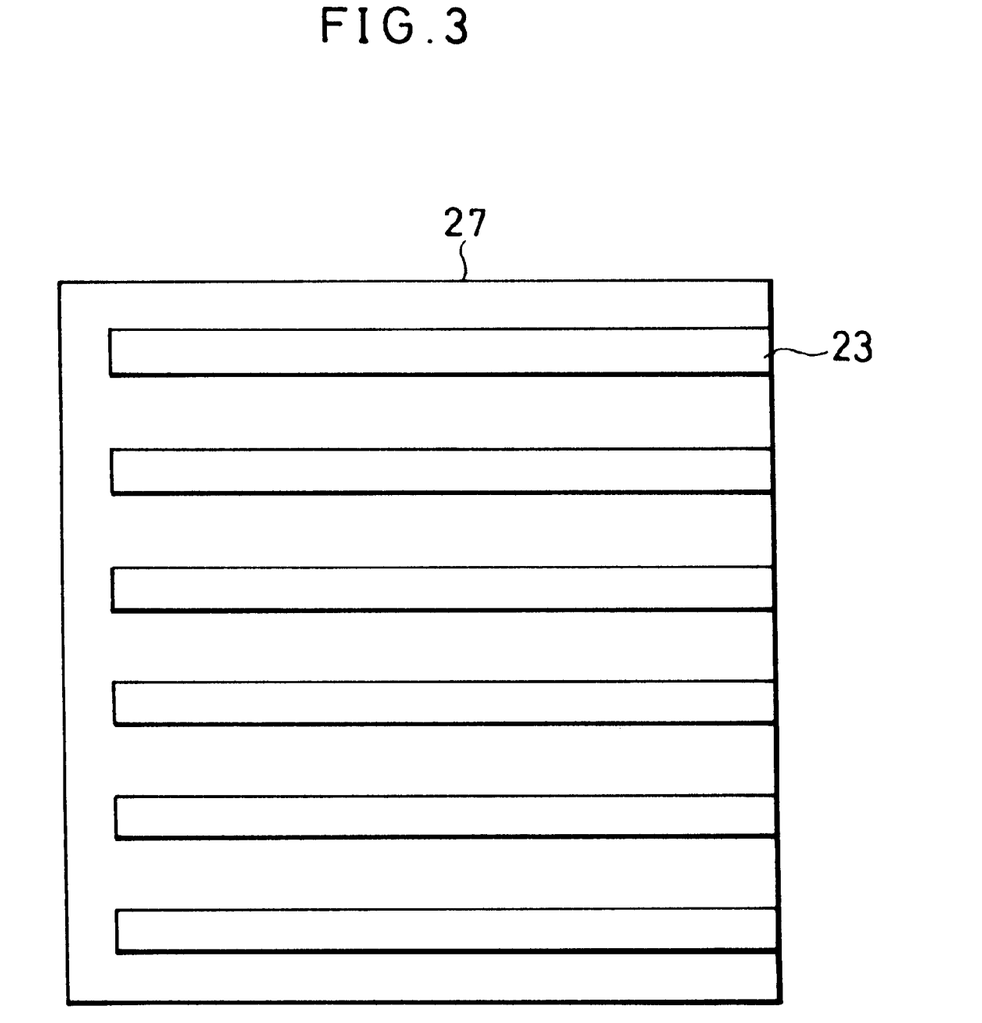
FIG. 3 is a view explaining a forming method of an exposed portion of an external outlet electrode portion of a gate signal line on the TFT array substrate in the manufacturing method of the liquid crystal display in accordance with one embodiment of the present invention.
Figure 4:
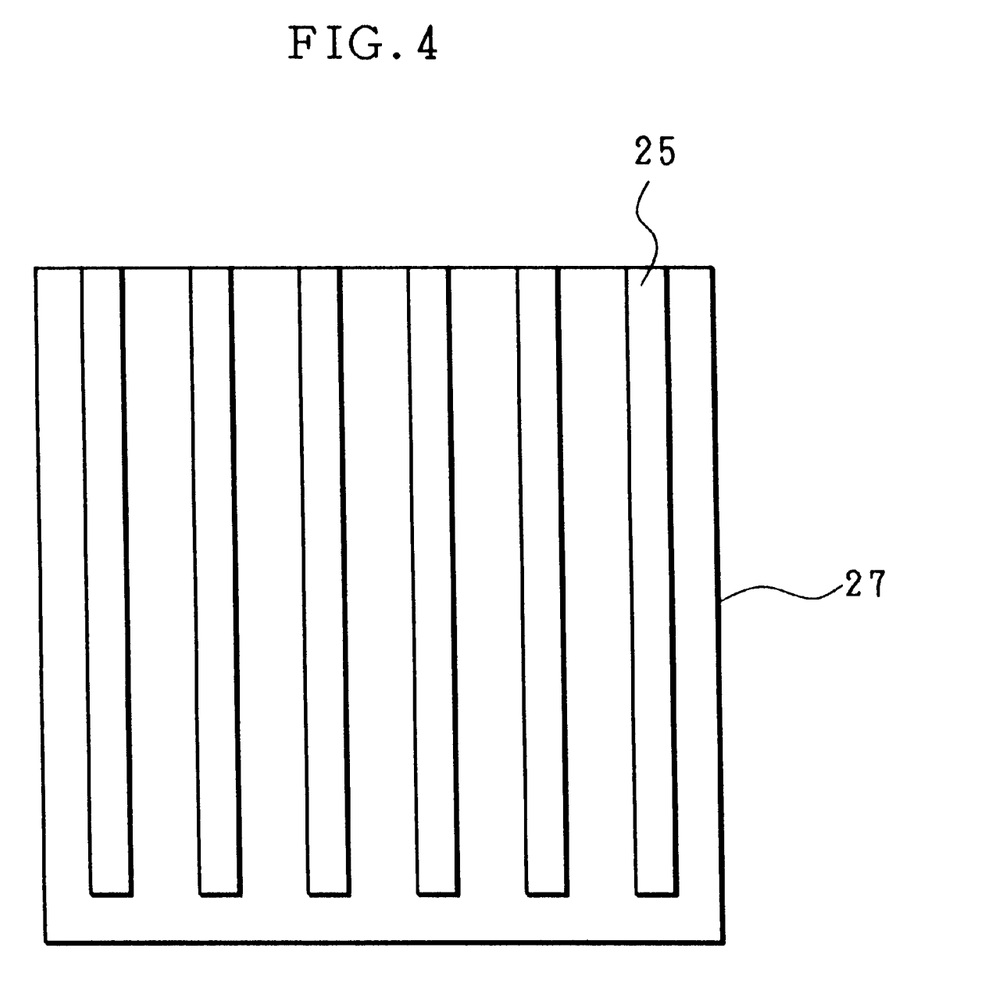
FIG. 4 is a view explaining a forming method of an exposed portion of an external outlet electrode portion of a source signal line on the TFT array substrate in the manufacturing method of the liquid crystal display in accordance with one embodiment of the present invention.

FIG. 3 is a view explaining a forming method of the exposed portion of the external outlet electrode portion 23 of the gate signal line on the TFT array substrate in accordance with the manufacturing method of the liguid crystal display of the present embodiment. FIG. 4 is a view explaining a forming method of the exposed portion of the external outlet electrode portion 25 of the source signal line of the TFT array substrate in accordance with the manufacturing method of the liquid crystal display of the present embodiment.

The external outlet electrode portion 23 of the gate signal line is initially formed as the post-etching first metal film 2 and second metal film 2' in the first photo-etching process shown in FIG. 1(a). Then, after the TFT 21 is formed by the processes shown in FIGS. 1(a) through 1(c) of Embodiment 1, the protection film 8 and insulating film 3 layered on the external outlet electrode portion 23 of the gate signal line, and the protection film 8 and insulting film 3 layered on the pixel electrode portion 26 and the outlet electrode portion 25 of the source signal line are photo-etched simultaneously in the fourth photo-etching process shown in FIG. 1(d), whereby the external outlet electrode portion 23 of the gate signal line is exposed on the TFT array substrate surface.

Then, the second metal film 2' on the exposed surface of the external outlet electrode portion 23 of the gate signal line is photo-etched simultaneously with the third metal film 7 and fourth metal film 7' on the external outlet electrode portion 25 of the source signal line and pixel electrode 26 by using the photomask used in the preceding photo-etching, whereby the external outlet terminal of the gate signal line 22 is formed.

Here, when exposed by photo-etching the protection film 8 and insulating film 3 simultaneously, more than one external outlet electrode portion 23 of the gate signal line is photo-etched using a single photomask. In other words, as shown in FIG. 3, by forming a contact hole 27 (an opening portion of the protection film 8 and insulating film 3) with a single mask pattern, a plurality of the external outlet electrode portions 23 of the gate signal lines are exposed through the contact hole 27.

According to the above method, unlike a case where a contact hole is made for the electrode of each of a plurality of the external outlet electrode portions 23 of the gate signal lines, no step-wise difference is formed in each electrode, that is, between each exposed portion and the protection film 8 and insulating film 3. Consequently, an unstable cross section structure caused by overhung is prevented. Thus, for example, the external outlet terminal of the gate signal line 22 can be readily connected to the outside driving circuit by means of TAB, etc.

The external outlet electrode portion 23 of the gate signal line may be exposed by removing the protecting film 8 and insulating film 3 completely, besides the above-discussed method of making the exposed portion through the contact hole. In this case, because the protection film 8 and insulating film 3 are removed completely, the labor of using the mask pattern can be omitted, thereby forming the exposed portion more efficiently.

Next, with reference to FIG. 4, the following will explain the forming method of the external outlet terminal of the source signal line 24 using the same principle as that of the external outlet terminal of the gate signal line 22.

The external outlet electrode portion 25 of the source signal line is initially formed as the post-etching transparent conductive film 6, third metal film 7, and fourth metal film 7' in the third photo-etching process shown in FIG. 1(c). Then, as shown in FIG. 1(d), in the fourth etching process, the protection film 8 layered on the external outlet electrode portion 23 of the gate signal line is photo-etched, whereby the external outlet electrode portion 25 of the source signal line is exposed on the TFT array substrate surface simultaneously with the pixel electrode 26 and the external outlet electrode portion 23 of the gate signal line.

Then, the third metal film 7 and fourth metal film 7' on the exposed surface of the external outlet electrode portion 25 of the source signal line are photo-etched again by using the photomask used in the preceding photo-etching. By photo-etching the third metal film 7 and fourth metal film 7' on the surface of the external outlet electrode portion 25 of the source signal line simultaneously with the second metal film 2' of the external outlet electrode portion 23 of the gate signal line and the third metal film 7 and fourth metal film 7' formed on the pixel electrode 26, the external outlet terminal of the source signal line 24 is formed.

Here, when exposed by photo-etching the protection film 8, more than one external outlet electrode portion 25 of the source signal line is photo-etched by using a single mask pattern. In other words, as shown in FIG. 4, by making a contact hole 27 (an opening portion of the protection film 8) by using a single mask pattern, a plurality of external outlet electrode portions 25 of the source signal lines are exposed within the contact hole 27.

According to the above method, unlike a case where a contact hole is made for the electrode of each of a plurality of the external outlet electrode portions 25 of the source signal lines, no step-wise difference is formed in each electrode, that is, between each exposed portion and the protection film 8. Consequently, an unstable cross section structure caused by overhung is prevented. Thus, for example, the external outlet terminal of the source signal line 24 can be readily connected to the outside driving circuit by means of TAB, etc.

Also, the external outlet electrode portion 25 of the source signal line may be exposed by removing the protecting film 8 completely, besides the above method of making the exposed portion through the contact hole. In this case, because the protection film 8 is removed completely, the labor of using the mask pattern can be omitted, thereby forming the exposed portion more efficiently.

As has been discussed, a manufacturing method of a liquid crystal display of the present invention is a manufacturing method of a liquid crystal display having a matrix of thin film transistors, gate signal lines for controlling the thin film transistors and source signal lines for supplying a data signal to the thin film transistors provided in such a manner so as to intersect with each other at right angles, pixel electrodes connected to the source signal lines via the thin film transistors, and a liquid crystal material withheld in a space between the pixel electrodes and a counter electrode provided to oppose the pixel electrodes, comprising processes set forth below.

That is, it is a manufacturing method of a liquid crystal display, composed of a thin film transistor array substrate having a glass substrate, gate signal lines and source signal lines provided in such a manner so as to intersect with each other on the glass substrate through an insulating film, thin film transistors provided to the intersections of the gate signal lines and source signal lines in one-to-one correspondence for supplying a pixel signal to the pixel electrodes by connecting the gate signal lines, source signal lines, and pixel electrodes, comprising:

a first photo-etching process of, after layering a first metal film and a second metal film on the glass substrate, forming a pattern of the gate signal lines and external outlet electrode potions thereof;

a second photo-etching process of, after layering an insulating film, a high-resistance semiconductor film and a low-resistance semiconductor film sequentially in this order on the substrate on which the pattern has been formed, forming a semiconductor film pattern of the thin film transistors;

a third photo-etching process of, after layering a transparent conductive film, a third metal film, and a fourth metal film sequentially in this order on the substrate on which the semiconductor film pattern has been formed, forming the source signal lines and external outlet electrode portions thereof, source electrodes, drain electrodes, and pixel electrodes of the thin film transistors, while removing the low-resistance semiconductor film on the exposed portion after the semiconductor film pattern is formed;

a fourth photo-etching process of, after layering a protection film on the substrate, letting the external outlet electrode portions of the gate signal lines, the external outlet electrode portions of the source signal lines, and the pixel electrodes be exposed, and a step of etching the second metal film, third metal film, and fourth metal film of the exposed external outlet electrode portions of the gate signal lines and source signal lines, and pixel electrodes.

According to the above method, the TFT array substrate of the liquid crystal display of the present invention is manufactured by the four photo-etching processes. Thus, not only can the manufacturing procedure be simplified, but also satisfactory adhesion can be given to the semiconductor film pattern and source metal film layer.

More specifically, even when the transparent conductive film 6, third metal film 7, and fourth metal film 7' are layered on the entire glass substrate 1, because the semiconductor film pattern has been already formed on the TFT 21 by selectively photo-etching the low-resistance semiconductor film 5 and high-resistance film 4 simultaneously, only a small interface is present between the semiconductor film layer and source metal film layer. Consequently, satisfactory adhesion is obtained between these layers and no film separation will occur, thereby making it possible to stabilize the yield.

In order to solve the conventional problems, the above method is preferably arranged in such a manner that the first metal film is made of titanium.

According to the above method, in case that the external outlet electrode portions of the gate signal lines having the first and second metal films are connected to the outside driving circuit by means of TAB (Tape Automated Bonding), by making the first metal film which will be made into the external outlet terminals of the gate signal lines out of titanium, and making the second metal film out of aluminum or the like, the photo-etching is effected selectively in such a manner that only titanium forming the first metal film is left, whereby the external outlet terminals of the gate signal lines can be made of titanium. Thus, according to the above method, because titanium is not readily oxidized compared with aluminum, a liquid crystal display which can ensure reliability of the electrical connection between the external outlet terminals made of titanium and the outside driving circuit can be readily manufactured in a stable manner.

The above method is preferably arranged in such a manner that the second metal film is made of aluminum or aluminum alloy.

According to the above method, an effect of reducing line resistance can obtained. At the same time, selective photo-etching which can leave only titanium forming the first metal film can be readily effected in a reliable manner.

The above method is preferably arranged in such a mnanner that the third metal film is made of molybdenum.

According to the above method, the third metal film made of molybdenum can prevent the ITO forming the pixel electrodes from directly touching aluminum, etc., thereby preventing electrical erosion by aluminum. Also, molybdenum can be readily removed by means of wet etching with an etchant mainly made of phosphoric acid and nitric acid, which is also used in wet etching aluminum. Thus, because molybdenum and aluminum can be removed simultaneously by means of wet etching, the manufacturing costs can be saved.

The above method is preferably arranged in such a manner that the fourth metal film is made of aluminum or aluminum alloy.

According to the above method, when the pixel electrodes and the external outlet terminals of the gate signal lines are exposed, the second and fourth metal films which are also made of aluminum or aluminum alloy can be wet etched. Consequently, the number of photo-etching processes can be reduced, thereby saving the manufacturing costs.

The above method is preferably arranged in such a manner that it further comprises the process of letting at least one of the external outlet electrode portions of the gate signal lines and the external outlet electrode portions of the source signal lines be exposed by means of photo-etching, and t hat at least one exposed portion of a plurality of the external outlet electrode portions of the gate signal lines and a plurality of the external outlet electrode portions of the source signal lines is formed in the form of a contact hole.

According to the above method, no step-wise difference is formed between each exposed portion and the protection film. Thus, no unstable cross section structure caused by overhung is produced. Consequently, for example, the external outlet terminals of the source signal lines can be readily connected to the outside driving circuit by means of TAB, etc.

The above method is preferably arranged in such a manner that it further comprises a process of letting the pixel electrodes be exposed by means of photo-etching, and exposed portions of the pixel electrodes are formed larger than the pixel electrodes.

According to the above method, the unwanted residual low-resistance semiconductor film between the pixel electrodes and source signal lines can be readily removed simultaneously when the pixel electrodes are exposed. Consequently, not only can a short-circuit be prevented, but also the yield can be improved.

Also, a manufacturing method of a liquid crystal display of the present invention is a manufacturing method of a liquid crystal display having a matrix of thin film transistors, gate signal lines for controlling the thin film transistors and source signal lines for supplying a data signal to the thin film transistors provided in such a manner so as to intersect with each other at right angles, pixel electrodes connected to the source signal lines via the thin film transistors, and a liquid crystal material withheld in a space between the pixel electrodes and a counter electrode provided to oppose the pixel electrodes, comprising processes set forth below.

That is, it is a manufacturing method of a liquid crystal display, composed of a thin film transistor array substrate having a glass substrate, gate signal lines and source signal lines provided in such a manner so as to intersect with each other on the glass substrate through an insulating film, thin film transistors provided to the intersections of the gate signal lines and source signal lines in one-to-one correspondence for supplying a pixel signal to the pixel electrodes by connecting the gate signal lines, source signal lines, and pixel electrodes, comprising:

a first photo-etching process of, after forming a first metal film on the glass substrate, forming a pattern of the gate signal lines and the external outlet electrode portions thereof;

a second photo-etching process of, after layering the insulating film, high-resistance semiconductor film, and low-resistance semiconductor film sequentially in this order on the substrate on which the pattern has been formed, forming a semiconductor film pattern of the thin film transistors;

a third photo-etching process of, after layering a transparent conductive film and a second metal film sequentially in this order on the substrate on which the semiconductor film pattern has been formed, forming the source signal lines, and external outlet electrode portions thereof, source, drain, and pixel electrodes of the thin film transistors, while removing the low-resistance semiconductor film of the exposed portion after the semiconductor film pattern has been formed; and a step of layering a protection film on the substrate.

According to the above method, the TFT array substrate of the liquid crystal display of the present invention can be manufactured by a simpler manufacturing procedure. At the same time, satisfactory adhesion can be obtained between the semiconductor film pattern and source metal film layer and no film separation will occur, thereby making it possible to stabilize the yield.

In order to solve the above problem, the above method is preferably arranged in such a manner that the first metal film is made of titanium.

According to the above method, in case that the external outlet electrode portions of the gate signal lines are connected to the outside driving circuit by means of TAB (Tape Automated Bonding), by making the first metal film which will be made into the external outlet terminals of the gate signal lines out of titanium which is not readily oxidized, a liquid crystal display which ensures electrical connection between the external outlet terminals and outside driving circuit can be manufactured in a stable manner.

The above method is preferably arranged in such a manner that it further comprises a process of letting at least one of the external outlet electrode portions of the gate signal lines and the external outlet electrode portions of the source signal lines be exposed by means of photo-etching, and that at least one exposed portion of a plurality of the external outlet electrode portions of the gate signal lines and a plurality of the external outlet electrode portions of the source signal lines is formed in the form of a contact hole.

According to the above method, no step-wise difference is formed between each exposed portion and the protection film, and therefore, no unstable cross section structure, caused by overhung is produced. Thus, for example, the external outlet terminals of the source signal lines can be readily connected to the outside driving circuit by means of TAB, etc.

The above method is preferably arranged in that it further comprises a process of letting the pixel electrodes be exposed by means of photo-etching, and exposed portions of the pixel electrodes are formed larger than the pixel electrodes.

According to the above method, the unwanted residual low-resistance semiconductor film between the pixel electrodes and source signal lines can be readily removed simultaneously when the pixel electrodes are exposed. Consequently, not only can a short-circuit be prevented, but also the yield can be improved.

Further, a manufacturing method of a liquid crystal display of the present invention is a manufacturing method of a liquid crystal display having a matrix of thin film transistors, gate signal lines for controlling the thin film transistors and source signal lines for supplying a data signal to the thin film transistors provided in such a manner so as to intersect with each other at right angles, pixel electrodes connected to the source signal lines via the thin film transistors, and a liquid crystal material withheld in a space between the pixel electrodes and a counter electrode opposing the pixel electrodes, comprising processes set forth below.

That is, it is a manufacturing method comprising the steps of:

forming a semiconductor film composed of at least two layers;

forming a semiconductor film pattern on the thin film transistors by effecting patterning on the semiconductor film; and a step of forming a conductive film on the substrate on which the semiconductor pattern has been formed.

According to the above method, the TFT array substrate of the liquid crystal display of the present invention has a smaller film stress produced by the semiconductor film composed of at least two layers. Consequently, satisfactory adhesion is obtained between the semiconductor film pattern and source metal film layer and no film separation will occur, thereby making it possible to stabilize the yield.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A manufacturing method of a liquid crystal display having a matrix of thin film transistors, gate signal lines for controlling said thin film transistors and source signal lines for supplying data signals to said thin film transistors provided in such a manner so as to intersect with each other at right angles, pixel electrodes in communication with said source signal lines via said thin film transistors, and a liquid crystal material between said pixel electrodes and a counter electrode provided to oppose said pixel electrodes, the method comprising:

effecting a first photo-etching after layering a first metal film and a second metal film sequentially on a substrate to form gate electrodes of said thin film transistors and gate signal lines and external outlet electrode portions of said gate signal lines;

layering an insulating film, a high-resistance semiconductor film, and a low-resistance semiconductor film entirely on said substrate on which a pattern has been formed in said first photo-etching;

effecting a second photo-etching on said low-resistance semiconductor film and high-resistance semiconductor film to form a semiconductor film patterns over said gate electrodes;

layering a transparent conductive film, a third metal film, and a fourth metal film sequentially and entirely on said substrate on which said semiconductor film patterns from said second photo-etching have been formed;

effecting third photo-etching on said fourth metal film, third metal film, transparent conductive film, and said low-resistance semiconductor film of said semiconductor film patterns so that to form said source signal lines, external outlet electrode portions of said source signal lines, source and drain electrodes of said transistors and pixel electrodes;

forming a protection film entirely on said substrate on which said source and drain electrodes and pixel electrodes have been formed;

effecting fourth photo-etching on said protection film and on said insulating film to let the external outlet electrode portions of said gate signal lines, the external outlet electrode portions of said source signal lines, and said pixel electrodes be exposed; and effecting etching on said second metal film, third metal film and fourth metal film of the external outlet electrode portions of said gate signal lines, the external outlet electrode portions of said source signal lines, and said pixel electrodes, all of which are now exposed.

2. The method of claim 1, wherein said first metal film is made of titanium.

3. The method of claim 1, wherein said second metal film is made of one of aluminum and aluminum alloy.

4. The method of claim 1, wherein said third metal film is made of molybdenum.

5. The method of claim 1, wherein said fourth metal film is made of one of aluminum and aluminum alloy.

6. The method of claim 1, wherein, in said fourth photo-etching, at least one of the external outlet electrode portions of said gate signal lines and the external outlet electrode portions of said source signal lines are exposed, and at least one exposed portion of a plurality of the external outlet electrode portions of said gate signal lines and a plurality of the external outlet electrode portions of said source signal lines is formed in the form of a common contact hole.

7. The method of claim 1, wherein, in said fourth photo-etching, exposed portions of said pixel electrodes are formed larger than said pixel electrodes.

8. The method of claim 1, wherein said etching comprises wet etching.

9. The method of claim 1, wherein only four photomasks are used in the method of manufacturing the liquid crystal display.

10. A manufacturing method of a liquid crystal display having a matrix of thin film transistors, gate signal lines for controlling said thin film transistors and source signal lines for supplying data signals to said thin film transistors provided in such a manner so as to cross each other at right angles, pixel electrodes in communication with said source signal lines via said thin film transistors, and a liquid crystal material between said pixel electrodes and a counter electrode provided to oppose said pixel electrodes, the method comprising:

- effecting first photo-etching after forming a first metal film to form gate electrodes of said thin film transistors, gate signal lines, and external outlet electrode portions of said gate signal lines;
- layering an insulating film, a high-resistance semiconductor film, and a low-resistance semiconductor film sequentially and entirely on said substrate on which a pattern has been formed in said first photo-etching;
- effecting second photo-etching on said low-resistance semiconductor film and high-resistance semiconductor film to form a semiconductor film pattern over said gate electrodes;
- layering a transparent conductive film and a second metal film sequentially and entirely on said substrate on which said semiconductor film pattern has been formed;
- effecting third photo-etching on said second metal film, transparent conductive film, and low-resistance semiconductor film of said semiconductor film pattern to form said source signal lines, external outlet electrode portions of said source signal lines, source and drain electrodes and pixel electrodes; and
- forming a protecting film on said substrate on which said source and drain electrodes and pixel electrodes have been formed.

11. The method of claim 10, wherein said first metal film is made of titanium.

12. The method of claim 10, further comprising the step of letting at least one of the external outlet electrode portions of said gate signal lines and the external outlet electrode portions of said source signal lines be exposed by means of photo-etching, at least one exposed portion of a plurality of the external outlet electrode portions of said gate signal lines and a plurality of the external outlet electrode portions of said source signal lines being formed in the form of a common contact hole.

13. The method of claim 10, further comprising the step of letting said pixel electrodes be exposed by means of photo-etching, exposed portions of said pixel electrodes being formed larger than said pixel electrodes.

14. A method of making an liquid crystal display including an array of thin film transistors, the method comprising:

- forming gate electrodes on a substrate;
- forming a pattern including a high resistance semiconductor layer and a low resistance semiconductor layer on the substrate over the gate electrodes, and patterning the semiconductor layers into areas over said gate electrodes;
- after said patterning of the semiconductor layers, depositing a layer system including (i) a transparent conductive layer, (ii) a first metal layer, and (iii) a second metal layer in this order on the substrate, at least partially over said gate electrodes and the patterned semiconductor layers;
- photo-etching each of said layers (i)–(iii) of said layer system using only one mask so as to form pixel regions, source signal lines, source electrodes, and drain electrodes;
- depositing an insulating layer over at least said pixel electrode regions, said source electrodes and said drain electrodes; and
- removing said insulating layer and said first and second metal layers from respective areas over said pixel regions so as to leave portions of said transparent conductive layer forming pixel electrodes of the liquid crystal display, so that said transparent conductive layer of said layer system forms said pixel electrodes and also forms part of each of said source signal lines, source electrodes, and drain electrodes.

15. The method of claim 14, wherein said photo-etching comprises using only a single photomask.

* * * * *